US006660666B1

United States Patent
Lin

(10) Patent No.: US 6,660,666 B1
(45) Date of Patent: Dec. 9, 2003

(54) INTEGRATED PROCESSING SYSTEM FOR FORMING AN INSULATING LAYER OF THIN FILM TRANSISTOR LIQUID CRYSTAL DISPLAY

(75) Inventor: Frank Lin, Hsinchu (TW)

(73) Assignee: Toppoly Optelectronics Corp., Miaoli Hsien (TW)

( * ) Notice: Subject to any disclaimer, the term of this patent is extended or adjusted under 35 U.S.C. 154(b) by 0 days.

(21) Appl. No.: 10/065,139

(22) Filed: Sep. 19, 2002

(51) Int. Cl.[7] ............................................. H01L 21/50
(52) U.S. Cl. ....................................................... 438/905
(58) Field of Search .................................. 438/905, 907

(56) References Cited

U.S. PATENT DOCUMENTS 5,303,671 A  *  4/1994  Kondo et al. ................ 118/719
6,409,839 B1  *  6/2002  Sun et al. .................... 118/726

* cited by examiner

Primary Examiner—David Nelms
Assistant Examiner—Quoc Hoang
(74) Attorney, Agent, or Firm—J.C. Patents

(57) ABSTRACT

A processing station for forming an insulating film comprises a chemical vapor deposition (CVD) unit, a cleaning unit, a cassette station that receives a plurality of substrates, and a transfer system. The transfer system effectuates the conveyance of a substrate being processed between the CVD unit, the cleaning unit, and the cassette station. The CVD unit is placed in a position facing the cassette station, the transfer system is disposed between the CVD unit and the cassette station, and the cleaning unit is positioned proximate to the transfer system. Within the processing station, a substrate is subjected to an operating cycle that includes a plurality of deposition passes alternated with at least a wet cleaning operation. Each deposition pass forms a thickness of insulating layer smaller than the desired thickness of insulating film. Each wet cleaning operation removes residual particles from an intermediary insulating layer.

4 Claims, 1 Drawing Sheet

INTEGRATED PROCESSING SYSTEM FOR FORMING AN INSULATING LAYER OF THIN FILM TRANSISTOR LIQUID CRYSTAL DISPLAY

BACKGROUND OF INVENTION

1. Field of the Invention

The invention relates generally to a semiconductor process and, more particularly, to an integrated processing system for forming an insulating film used in thin film transistor liquid crystal display.

2. Description of the Related Art

The applications of thin film transistors (TFT) are numerous, more particularly in liquid crystal display (LCD) devices. LCD devices are known for their advantageous low operating voltages, absence of radiation, lightweight, and smaller dimensional size. As electronic appliances increasingly become portable and smaller, the use of TFT-LCD devices is therefore incumbent.

TFT-LCD usually includes an insulating film that is formed via a plasma enhanced chemical vapor deposition (PECVD) performed in a PECVD station. After the formation of the insulating film is completed, residual particles may deposit on the insulating film, which causes short-circuit through the insulating film and other types of failure of other components. A cleaning operation is therefore conventionally performed after the formation of the insulating layer on the substrate is completed to remove the residual particles. However, some residual particles may still remain after this traditional cleaning operation, and even if the residual particles are removed, they leave pinholes on the surface of the insulating film so that, consequently, it is not smooth. Because the back and forth movement of the substrate between the different cleaning and deposition stations is conventionally achieved by means of automatically or manually guided vehicles, the risk of pollution of the substrate by environmental contaminants is further increased.

SUMMARY OF INVENTION

An aspect of the invention is therefore to provide a method of forming an insulating film used in thin film transistor liquid crystal display and a processing station implementing the same method that can reduce the amount of residual particles on the insulating film. Thereby, failure and short-circuit of the insulating film are prevented and the yield is increased.

Another aspect of the invention is to provide a processing station that can reduce the conveyance time of the substrate being processed to form the insulating film.

To accomplish the above and other objectives, the invention respectively provides a method of forming a TFT-LCD insulating film that integrates deposition and cleaning operations and a processing station implementing the same method. The processing station comprises a chemical vapor deposition (CVD) unit in which the substrate is subjected to the deposition of a layer of insulating material, a cleaning unit in which the substrate is cleaned, a cassette station where a plurality of substrates are stored, and a transfer system for substrate conveyance. The substrates received in the cassette station are either substrates on standby to be processed to form an insulating film or substrates for which the formation of the insulating film is completed. The CVD unit is placed in a position facing the cassette station, the transfer system is disposed between the CVD unit and the cassette station, and the cleaning unit is positioned proximate to the transfer system. The relative disposition of the CVD unit, the cassette station, the cleaning unit and the transfer system is such that the transfer system is capable of conveying a substrate being processed between the cassette station, the CVD unit, and the cleaning unit.

To form a desired thickness of insulating film, a substrate is subjected to an operating cycle of the processing station as follows. The operating cycle includes a plurality of deposition passes, preferably two passes, alternated with at least a cleaning operation, and is performed until the desired thickness of the insulating film is obtained. Each deposition pass forms an intermediate thickness of insulating layer over the substrate that is smaller than the final thickness of the desired insulating film. Each cleaning operation, preferably wet cleaning, removes residual particles from an intermediary insulating layer. The conveyance of the substrate being processed between the cassette station, the CVD unit and the cleaning unit is achieved by means of the transfer system.

It is to be understood that both the foregoing general description and the following detailed description are exemplary, and are intended to provide further explanation of the invention as claimed.

BRIEF DESCRIPTION OF DRAWINGS

The accompanying drawing is included to provide a further understanding of the invention, and is incorporated in and constitutes a part of this specification. The drawing illustrates an embodiment of the invention and, together with the description, serves to explain the principles of the invention. In the single drawing.

DETAILED DESCRIPTION

Figure 1:
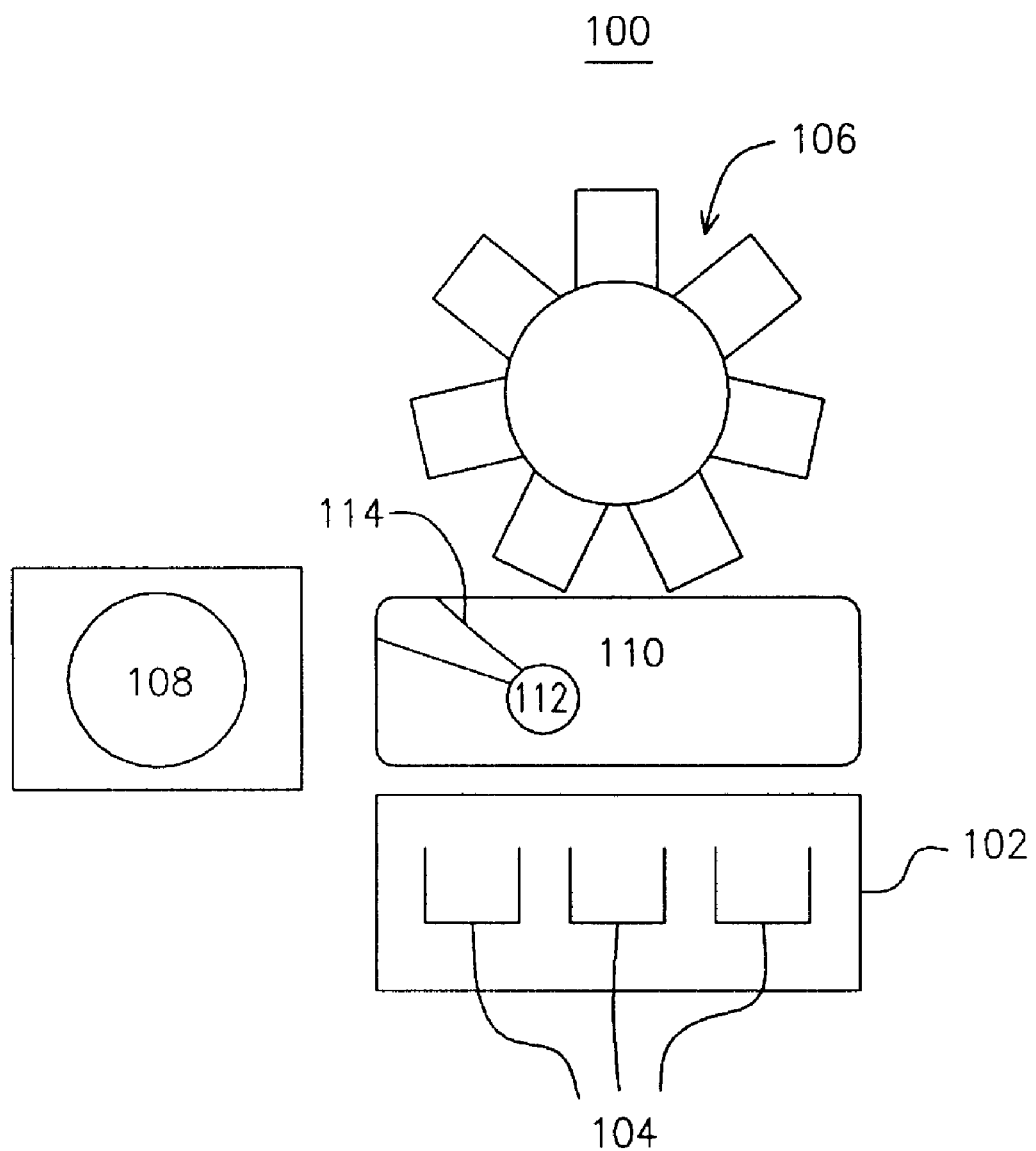
FIG. 1 is a general schematic view of an embodiment of the invention.

The following detailed description of the embodiments and examples of the present invention with reference to the accompanying drawings is only illustrative and not limiting. Wherever possible in the following description and accompanying drawings, like reference numerals and symbols will refer to like elements and parts unless otherwise described.

The invention provides a processing station that is capable of forming an insulating film used in thin film transistor (TFT) liquid crystal display (LCD) via an operating cycle that integrates chemical vapor deposition (CVD) cleaning operations. This integrated operating cycle is implemented in the processing station of the invention principally by integrating a CVD unit and a cleaning unit within a same processing station.

Referring to FIG. 1, a schematic view illustrates a processing station for forming an insulating film of TFT-LCD according to an embodiment of the invention. As illustrated, a processing station 100 for fabricating an insulating film according to the invention comprises a CVD unit 106, a cleaning unit 108, a cassette station 102 and a transfer system 110. The CVD unit 106 principally includes a CVD chamber, a temperature control system, a gas circuit system, a pressure control system and a radio frequency (RF) generator to achieve a deposition operation on a substrate 112. The cleaning unit 108 includes a cleaning apparatus such as a scrubber. The cassette station 102 includes a plurality of substrate cassettes 104 where are stored substrates that are either substrates on standby to be processed through the processing station or substrates that have been processed by the processing station and are on standby for the next process steps. The CVD unit 106 is preferably placed in a manner facing the cassette station 104, the transfer system 110 is arranged between the cassette station 104 and the CVD unit 106, and the cleaning unit 108 is disposed proximate to the transfer system 110. Such a disposition enables optimal operation of the transfer system 110, preferably a mechanical arm 114, to convey the substrate being processed between the cassette station 104, the CVD unit 106, and the cleaning unit 108.

To form an insulating film, a substrate is processed in the processing station according to the following operating cycle. A substrate (not shown) initially stored in one cassette 104 of the cassette station 102 is retrieved and transferred into the CVD unit 106 by means of the transfer system 110.

Within the CVD unit 106, a first deposition is performed to form a first layer of deposition that is, preferably, but not limited to, approximately half (it may be more or less) the desired thickness of the insulating film to be formed. The CVD achieved may be, for example, a plasma enhanced CVD (PECVD), in the case of an insulating film of TFT-LCD.

After the first deposition is completed, the substrate is retrieved from the CVD unit 106 and is transferred into the cleaning unit 108 where it is subjected to a wet cleaning to remove residual particles from the first insulating layer. The wet cleaning is, for example, a physical cleaning such as a wet cleaning by spraying or brushing. After the cleaning step, pinholes are typically formed on the first insulating layer due to the removal of the residual particles. Via the transfer system 110, the cleaned substrate is transferred into the CVD unit 106 for deposition of a second insulating layer over the first insulating layer. The second insulating layer fills the pinholes of the first insulating layer and further completes the necessary film thickness to the final thickness of the insulating layer. Because residual particles are not likely to deposit at the same locations on both first and second insulating layers, the pinholes left by the removal of the residual particles can be therefore filled and the final insulating layer, achieved through several deposition passes alternated with cleaning steps, is therefore reinforced. As a result, weakened portions of intermediary layers caused by residual particle deposition are prevented, and the yield is increased. Once the desired thickness of the insulating film is achieved, the substrate is finally transferred via the transfer system 110 to the cassette station 102 on standby for the next process steps.

As described above, the invention therefore includes the following features. Since the desired insulating film is deposited through several deposition passes alternated with at least one cleaning step, residual particles that may deposit on the intermediary insulating layers are therefore favorably removed, and the pinholes left after the removal of the residual particles are filled up. As a result, short-circuit and other failures of the insulating film are prevented.

Furthermore, because the processing station integrates the cleaning and deposition operations in a same operating cycle, which is achieved via an integration of the CVD and cleaning units and an adequate disposition of the transfer system, the conveyance time of the substrates being processed is therefore reduced. As a result, the conventional use of automatically or manually guided vehicles is not needed, which further diminishes the occurrence of deposition of environmental contaminants on the insulating film.

It should be apparent to those skilled in the art that other structures that are obtained from various modifications and variations of the above-described structures of the invention would be possible without departing from the scope and spirit of the invention as illustrated herein. Therefore, the above description of embodiments and examples only illustrates specific ways of making and performing the invention that, consequently, should cover variations and modifications thereof, provided they fall within the inventive concepts as defined in the following claims.

What is claimed is:

1. A method of forming an insulating film on a substrate by means of a processing station that comprises a cassette station, a chemical vapor deposition (CVD) unit placed in a position facing the cassette station, a transfer system between the CVD unit and the cassette station, and a cleaning unit proximate to the transfer system, the method comprising: providing a substrate in the cassette station; and performing an operating cycle to form a desired thickness of insulating film on the substrate, the operating cycle including: performing a plurality of deposition passes alternated with at least a cleaning operation until the desired thickness of insulating film is achieved on the substrate, wherein each deposition pass is performed by means of the CVD unit to form an intermediate thickness of insulating layer over the substrate that is smaller than the desired thickness of the insulating film, each cleaning operation is performed by means of the cleaning unit to remove residual particles from an intermediary insulating layer, and the conveyance of the substrate being processed between the cassette station, the CVD unit and the cleaning unit is achieved by means of the transfer system.

2. The method of claim 1, wherein the deposition passes include plasma enhanced chemical vapor depositions.

3. The method of claim 1, wherein the cleaning operation includes a wet cleaning by spraying or a wet cleaning by brushing.

4. The method of claim 1, wherein the operating cycle includes two deposition passes and one cleaning operation.

* * * * *